United States Patent
Murakami

(10) Patent No.: US 7,141,453 B2
(45) Date of Patent: Nov. 28, 2006

(54) METHOD OF MOUNTING WAFER ON PRINTED WIRING SUBSTRATE

(75) Inventor: Takehiko Murakami, Fuchu (JP)

(73) Assignee: Minami Co., Ltd., Tokyo (JP)

( * ) Notice: Subject to any disclaimer, the term of this patent is extended or adjusted under 35 U.S.C. 154(b) by 158 days.

(21) Appl. No.: 10/939,493

(22) Filed: Sep. 14, 2004

(65) Prior Publication Data

US 2005/0070050 A1    Mar. 31, 2005

(30) Foreign Application Priority Data

Sep. 25, 2003  (JP)  ............................ 2003-332935
Jun. 25, 2004  (JP)  ............................ 2004-187764

(51) Int. Cl.
*H01L 21/44*  (2006.01)
(52) U.S. Cl. ............................... 438/125; 257/E21.509
(58) Field of Classification Search ................ 438/125, 438/617; 257/E21.509
See application file for complete search history.

(56) References Cited

U.S. PATENT DOCUMENTS 5,962,917 A * 10/1999 Moriyama .................. 257/697
5,981,311 A * 11/1999 Chia et al. .................. 438/125
6,026,564 A *  2/2000 Wang et al. .................. 29/830

* cited by examiner

*Primary Examiner*—Chandra Chaudhari
(74) *Attorney, Agent, or Firm*—Bacon & Thomas, PLLC

(57) ABSTRACT

To make it possible to utilize both surfaces of a wafer, a wafer (1) is provided with a through hole (2) between upper and lower surfaces, an insulating layer (14) is formed in an inner surface of the through hole (2), rewiring circuits (3, 4) are formed on both the upper and lower surfaces, the rewiring circuits (3, 4) are connected by a plating (9) applied on the insulating layer (14) within the through hole (2), thermal stress relaxing posts (5, 6) are formed on the rewiring circuits (3, 4) by a conductive material such as a solder bumps (7, 8) are formed on the thermal stress relaxing posts (5, 6), and the solder bump (7) or (8) is connected to a wiring circuit (12) of a printed wiring substrate (11).

6 Claims, 5 Drawing Sheets

--Prior Art--

--Prior Art--

--Prior Art--

METHOD OF MOUNTING WAFER ON PRINTED WIRING SUBSTRATE

BACKGROUND OF THE INVENTION

1. Field of the Invention

The present invention relates to a method of mounting a wafer on a printed wiring substrate.

2. Description of Background Art

A conventional method of mounting a wafer such as an IC or the like on a printed wiring substrate is structured as shown in FIG. 7. The structure is made such that a wiring circuit 101 is formed on a top surface of a printed wiring substrate 100, and a wafer 102 is provided with electrodes 103 and 103 on a top surface or a side surface thereof. Further, the wafer 102 is first mounted on the printed wiring substrate 100 as shown in FIG. 7(1), the electrodes 103 and 103 of the wafer 102 next connected to the wiring circuit 101 of the printed wiring substrate 100 by wires 104 and 104 as shown in FIG. 7(2), and the portion of the wires 104 and 104 are finally sealed 105 by a resin as shown in FIG. 7(3).

However, in the case of the conventional method mentioned above, only one side surface of the wafer can be used.

Further, as a different mounting method from that mentioned above, as shown in FIG. 8, there is a mounting method by forming a rewiring circuit 107 on one surface of a wafer 106, forming a solder bump 108 in the rewiring circuit, and bonding the solder bump 108 to the wiring circuit 101 of the printed wiring substrate 100. In this case, a thermal stress relaxing post is omitted in the drawing.

In the case of the mounting method mentioned above, as is different from the mounting method first mentioned, piled plural wafers can be mounted. In other words, it is possible to use both upper and lower surfaces. Accordingly, in the case of the mounting method mentioned above, the structure is made such that a printed wiring sheet 109 as shown in FIG. 9 is adhered to a top surface of the wafer 106 in a lowest stage which is directly bonded to the printed wiring substrate 100, a solder bump 112 formed in a rewiring circuit 111 in a wafer 110 in an upper stage side is bonded thereto, and the printed wiring sheet 109 and the wiring circuit 101 of the printed wiring substrate 100 are connected by a wire 113.

However, in accordance with the mounting method mentioned above, it is necessary to prepare the printed wiring sheet 109 in addition to the wafer, and extra labor and time are required. Further, when adhering the printed wiring sheet 109 to the wafer, it is necessary to align positions of both the elements, so that workability is deteriorated. Further, labor for connecting by the wire 113 one by one is required.

SUMMARY OF THE INVENTION

The present invention is made by taking the points mentioned above into consideration, and an object of the present invention is to provide a method of mounting a wafer to a printed wiring substrate, which makes it possible to utilize both surfaces of the wafer, by providing a through hole between upper and lower surfaces in the wafer, forming rewiring circuits on both upper and lower surfaces of the wafer, and connecting the rewiring circuit by a plating applied within the through hole.

Accordingly, the present invention provides the following mounting method as a summary.

(1) A method of mounting a wafer to a printed wiring substrate comprising the steps of:

providing a through hole between upper and lower surfaces in a wafer;

forming rewiring circuits on both upper and lower surfaces respectively in accordance with a plating;

forming a thermal stress relaxing post on the rewiring circuit by a conductive material such as a solder or the like;

forming a solder bump on the thermal stress relaxing post;

connecting the rewiring circuits on the upper and lower surfaces to each other by a plating applied within the through hole; and bonding the solder bump of the wafer to the wiring circuit of the printed wiring substrate.

(2) A method of mounting a wafer to a printed wiring substrate comprising the steps of:

providing a through hole between upper and lower surfaces in a wafer;

forming rewiring circuits on both upper and lower surfaces respectively in accordance with a plating;

forming a thermal stress relaxing post on the rewiring circuit in the upper surface side by a conductive material such as a solder or the like;

forming a solder bump on the thermal stress relaxing post;

forming an output terminal on the rewiring circuit in the lower surface side;

connecting the rewiring circuits on the upper and lower surfaces to each other by a plating applied within the through hole; and bonding the output terminal of the wafer to the wiring circuit of the printed wiring substrate.

(3) A method of mounting a wafer to a printed wiring substrate comprising the steps of:

providing a through hole between upper and lower surfaces in a wafer;

forming an insulating layer on an inner surface of the through hole;

forming rewiring circuits on both upper and lower surfaces respectively in accordance with a plating;

forming a thermal stress relaxing post on the rewiring circuit by a conductive material such as a solder or the like;

forming a solder bump on the thermal stress relaxing post;

connecting the rewiring circuits on the upper and lower surfaces to each other by a plating applied on the insulating layer within the through hole; and bonding the solder bump of the wafer to the wiring circuit of the printed wiring substrate.

(4) A method of mounting a wafer to a printed wiring substrate comprising the steps of:

providing a through hole between upper and lower surfaces in a wafer;

forming an insulating layer on an inner surface of the through hole;

forming rewiring circuits on both upper and lower surfaces respectively in accordance with a plating;

forming a thermal stress relaxing post on the rewiring circuit in the upper surface side by a conductive material such as a solder or the like;

forming a solder bump on the thermal stress relaxing post;

forming an output terminal in the rewiring circuit in the lower surface side;

connecting the rewiring circuits on the upper and lower surfaces to each other by a plating applied on the insulating layer within the through hole; and bonding the outer terminal of the wafer to the wiring circuit of the printed wiring substrate.

Further, in the method of mounting the wafer to the printed wiring substrate as recited in the items (1) to (4) mentioned above, the structure may be made such that the through holes are provided lengthwise and breadthwise in a grid shape on one wafer, the rewiring circuit is formed in each of portions surrounded by the through holes, and the wafer is cut at positions of the through holes. In this case, a lot of wafers can be manufactured simultaneously.

In accordance with a best mode for carrying out the present invention, the method comprises the steps of:

providing a through hole between upper and lower surfaces in a wafer;

forming rewiring circuits on both upper and lower surfaces respectively in accordance with a plating;

forming a thermal stress relaxing post on the rewiring circuit by a conductive material such as a solder or the like;

forming a solder bump on the thermal stress relaxing post;

connecting the rewiring circuits on the upper and lower surfaces to each other by a plating applied within the through hole; and bonding the solder bump of the wafer to the wiring circuit of the printed wiring substrate.

BRIEF DESCRIPTION OF THE DRAWINGS

FIG. 4 is a perspective view of one of wafers cut in a chip shape shown by omitting a rewiring circuit or the like;

DESCRIPTION OF THE PREFERRED EMBODIMENTS

Embodiment 1

A description will be given below of embodiments in accordance with the present invention with reference to the accompanying drawings.

Figure 1:
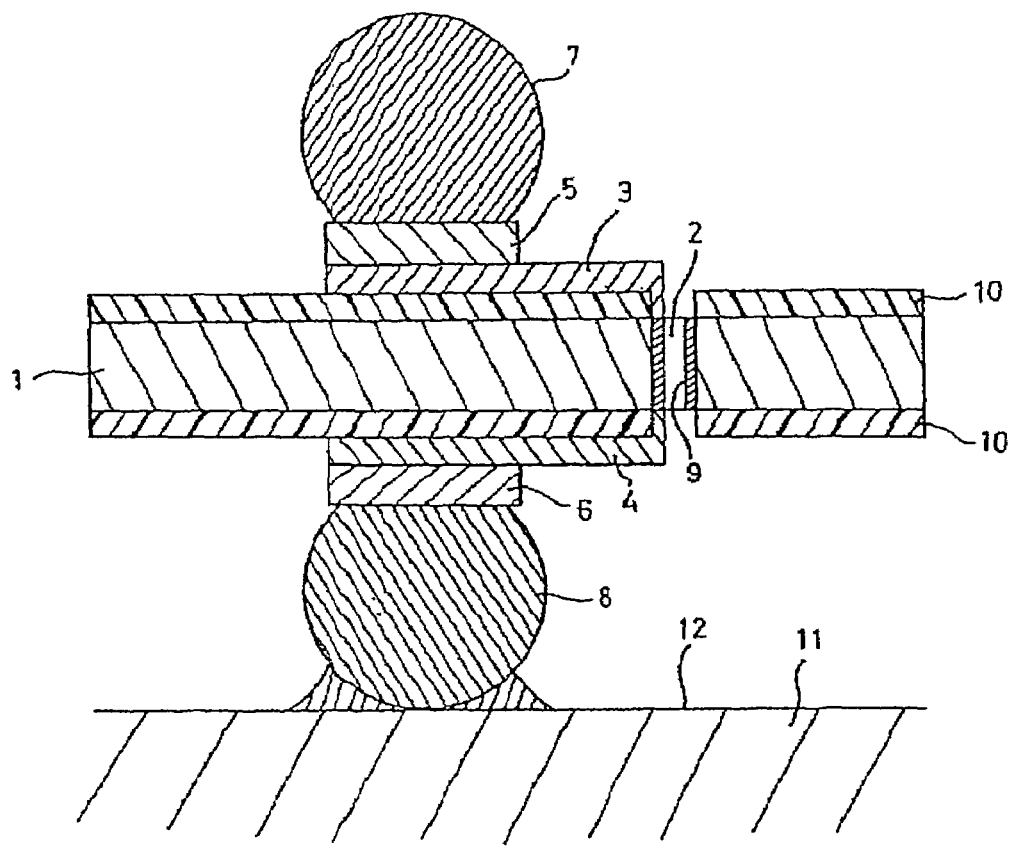
FIG. 1 is a schematic view of an embodiment 1 in accordance with the present invention.

FIG. 1 is a schematic view of an embodiment 1 in accordance with the present invention.

In the drawing, reference numeral 1 denotes a wafer. The wafer 1 is provided with through holes 2 betwenn upper and lower surfaces at desired positions.

Reference numerals 3 and 4 denote a rewiring circuit formed on both upper and lower surfaces of the wafer 1 in accordance with a plating. Reference numerals 5 and 6 denote a thermal stress relaxing post formed on the respective rewiring circuits 3 and 4 and made of a conductive material such as a solder or the like. The thermal stress relaxing posts 5 and 6 are formed in accordance with screen printing in the present embodiment. Reference numerals 7 and 8 denote a solder bump formed on the respective thermal stress relaxing posts 5 and 6. Further, the rewiring circuits 3 and 4 are connected to each other by a plating 9 applied within the through holes 2.

Reference numeral 10 denotes an insulating layer formed on both the upper and lower surfaces of the wafer 1.

reference numeral 11 denotes a printed wiring substrate. The solder bump 7 or 8 of the wafer 1 is bonded to a wiring circuit 12 of the printed wiring substrate 11.

Embodiment 2

Figure 2:
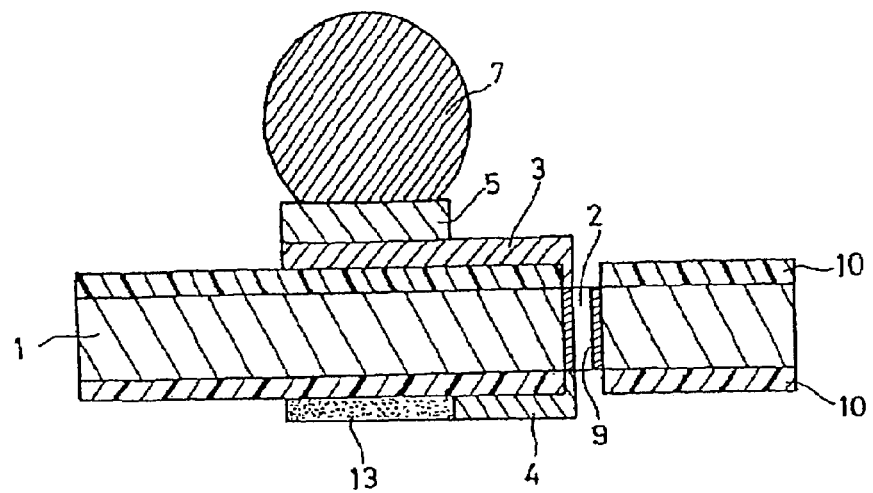
FIG. 2 is a schematic view of an embodiment 2 in accordance with the present invention.

Next, a description will be given of an embodiment 2 in accordance with the present invention shown in FIG. 2.

A difference between the present embodiment and the embodiment 1 exists in a point that an output terminal 13 is formed in the lower surface side rewiring circuit 4 in the present embodiment in place of the solder pump. In this case, since the other structures are the same as those of the embodiment 1 mentioned above, the same reference numerals are attached to the same members and a detailed description thereof will be omitted.

Embodiment 3

Figure 3:
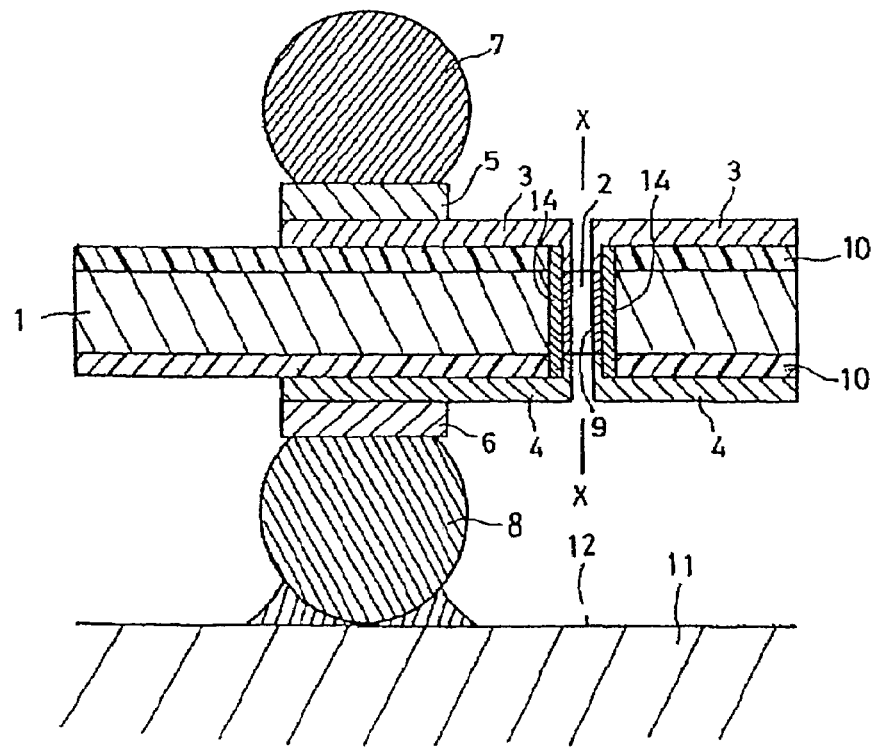
FIG. 3 is a schematic view of an embodiment 3 in accordance with the present invention.

Next, a description will be given of an embodiment 3 in accordance with the present invention shown in FIG. 3.

A difference between the present embodiment and the embodiment 1 exists in a point that an insulating layer 14 is formed on an inner surface of the through hole 2, and the rewiring circuits 3 and 4 on both the upper and lower surfaces of the wafer 1 are connected by the plating 9 applied on the insulating layer 14 within the through hole 2, in the present embodiment. In this case, since the other structures are the same as those of the embodiment 1 mentioned above, the same reference numerals are attached to the same members and a detailed description thereof will be omitted.

Embodiment 4

Figure 6:
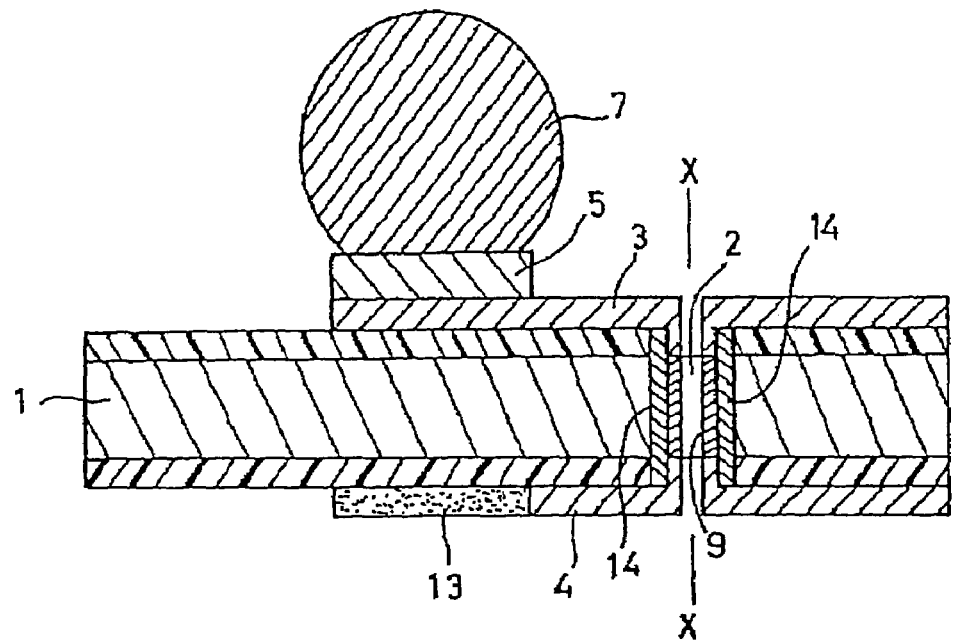
FIG. 6 is a schematic view of an embodiment 4 in accordance with the present invention.
Figure 7:
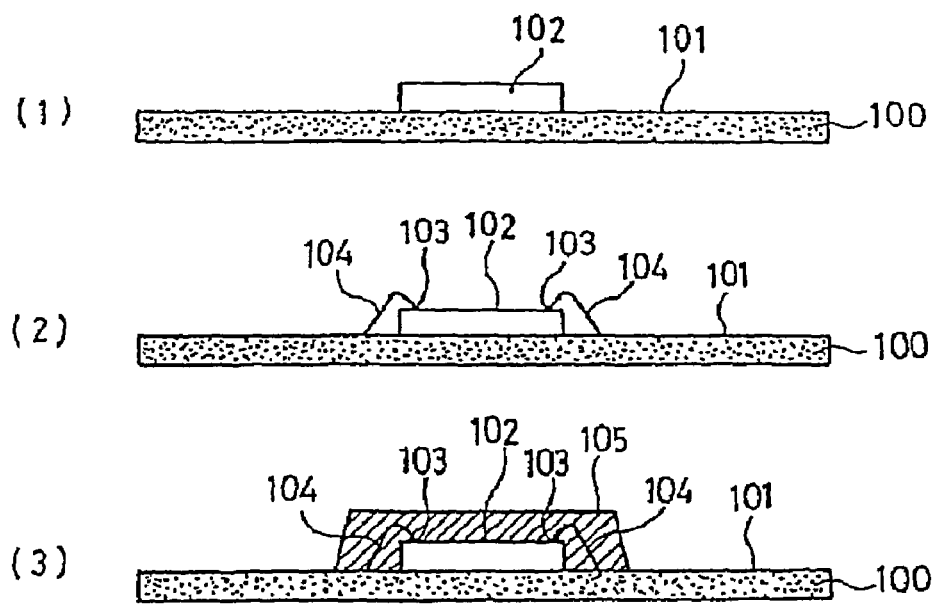
FIG. 7 is a schematic view explaining a process of a conventional mounting method.

Next, a description will be given of an embodiment 4 in accordance with the present invention shown in FIG. 6.

A difference between the present embodiment and the embodiment 1 exists in a point that the insulating layer 14 is formed on the inner surface of the through hole 2, and rewiring circuits 3 and 4 on both the upper and lower surfaces of the wafer 1 are connected by the plating 9 applied on the insulating layer 14 within the through hole 2, and an output terminal 13 is formed in the rewiring circuit 4 in the lower surface side in place of the solder bump, in the present embodiment. In this case, since the other structures are the same as those of the embodiment 1 mentioned above, the same reference numerals are attached to the same members and a detailed description thereof will be omitted.

Figure 4:
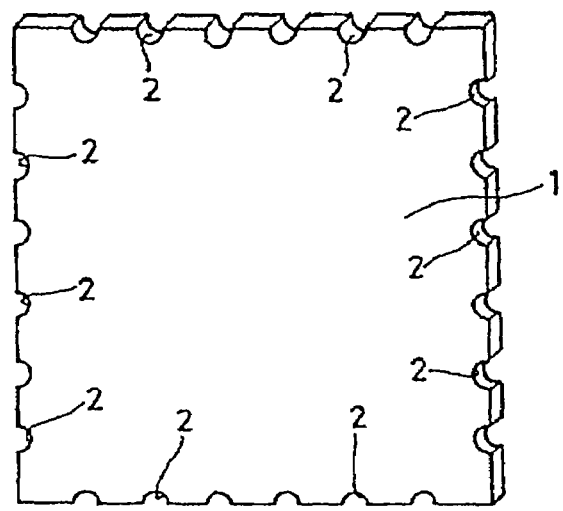
Figure 5:
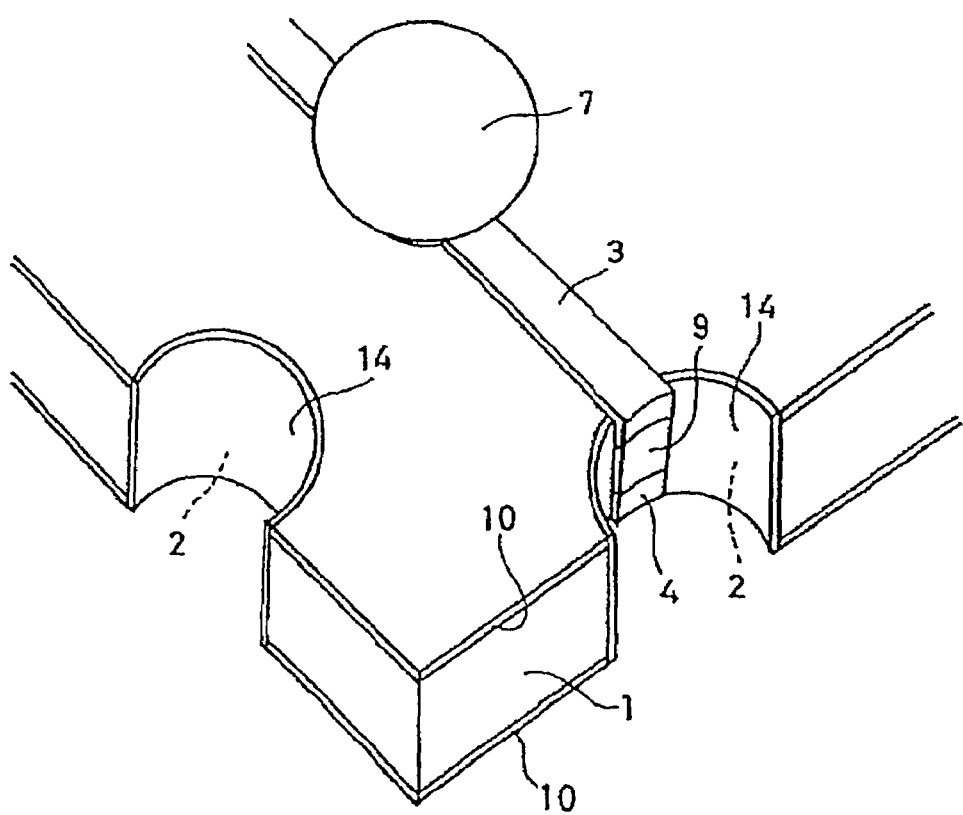
FIG. 5 is a perspective view of a main portion of the embodiment 3 in accordance with the present invention.

Further, in the embodiments 1 to 4 mentioned above, the structure may be made such that the through holes 2 are provided lengthwise and breadthwise in a grid shape on one wafer 1, the rewiring circuit is formed in each of portions surrounded by the through holes 2, and the wafer 1 is cut at a position of the through hole 2 shown by a line X—X in the drawing. One of the wafers cut in a chip shape in the manner mentioned above is shown in FIG. 4. In this case, the rewiring circuit and the like are omitted in FIG. 4.

Figure 8:
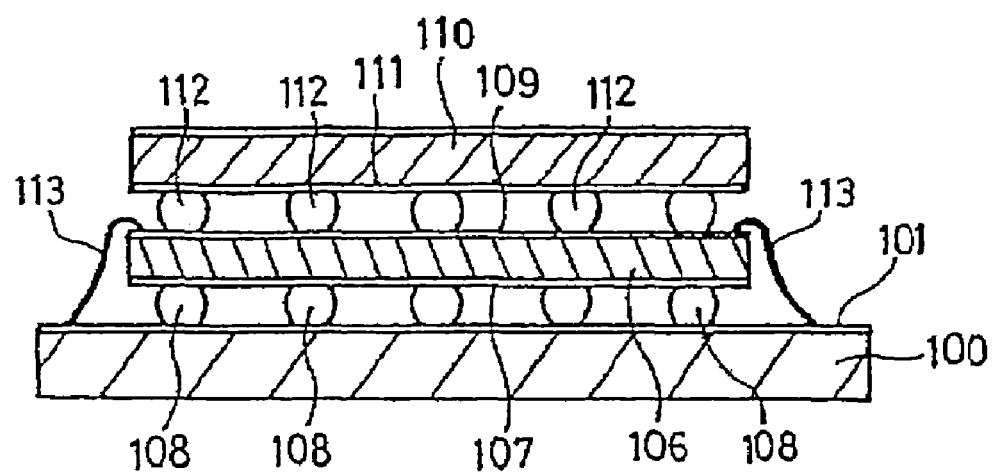
FIG. 8 is a schematic view explaining another conventional mounting method.
Figure 9:
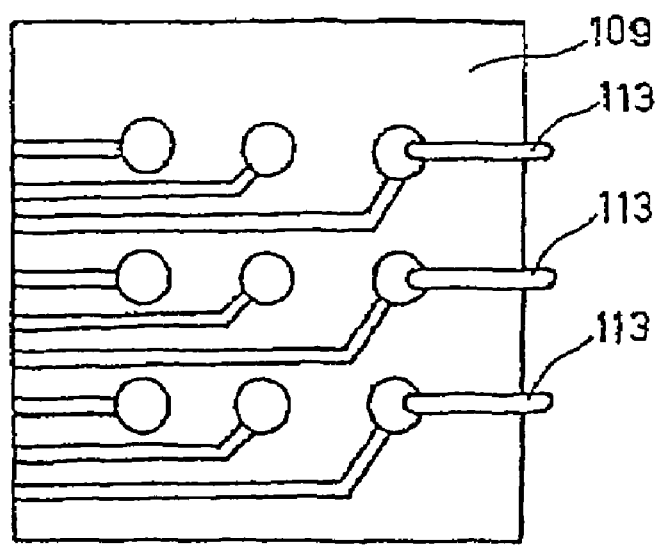
FIG. 9 is a plan view of a printed wiring sheet used in the mounting method shown in FIG. 8.

Since the present invention is structured such that the through holes are provided between the upper and lower surfaces, the rewiring circuit is formed in both the upper and lower surfaces of the wafer, and the rewiring circuit is connected by the plating applied within the through hole, both the surfaces of the wafer can be utilized. Further, in accordance with the structure mentioned above, for example, it is possible to mount a wafer on another wafer to be piled, and it is possible to increase a number of the mounted wafers. Further, it is possible to use the upper surface rewiring circuit formed on the wafer as an input side, and use the lower surface rewiring circuit as an output side. Further, the printed wiring sheet required for mounting piled plural wafers as shown in FIG. 8 in the conventional mounting method is not required, whereby it is possible to reduce a cost and it is possible to omit a labor for adhering the printed wiring sheet to the wafer. Further, the labor for connecting by the wire one by one is not required.

Further, in the case of providing the through holes lengthwise and breadthwise in a grid shape on one wafer, forming the rewiring circuit in each of the portions surrounded by the through holes and cutting the wafer at the positions of the through holes, it is possible to manufacture a lot of wafers simultaneously.

What is claimed is:

1. A method of mounting a wafer to a printed wiring substrate comprising the steps of:
    providing a through hole between upper and lower surfaces in a wafer;
    forming rewiring circuits on both upper and lower surfaces respectively in accordance with a plating;
    forming a thermal stress relaxing post on said rewiring circuit in the upper surface side by a conductive material;
    forming a solder bump on said thermal stress relaxing post;
    forming an output terminal on said rewiring circuit in the lower surface side;
    connecting the rewiring circuits on said upper and lower surfaces to each other by a plating applied within said through hole; and
    bonding the output terminal of said wafer to the rewiring circuit of the printed wiring substrate.

2. A method of mounting a wafer to a printed wiring substrate comprising the steps of:
    providing a through hole between upper and lower surfaces in a wafer;
    forming an insulating layer on an inner surface of said through hole;
    forming rewiring circuits on both upper and lower surfaces respectively in accordance with a plating;
    forming a thermal stress relaxing post on said rewiring circuit by a conductive material;
    forming a solder bump on said thermal stress relaxing post;
    connecting the rewiring circuits on said upper and lower surfaces to each other by a plating applied on the insulating layer within said through hole; and
    bonding the solder bump of said wafer to the rewiring circuit of the printed wiring substrate.

3. A method of mounting a wafer to a printed wiring substrate comprising the steps of:
    providing a through hole between upper and lower surfaces in a wafer;
    forming an insulating layer on an inner surface of said through hole;
    forming rewiring circuits on both upper and lower surfaces respectively in accordance with a plating;
    forming a thermal stress relaxing post on said rewiring circuit in the upper surface side by a conductive material;
    forming a solder bump on said thermal stress relaxing post;
    forming an output terminal in said rewiring circuit in the lower surface side;
    connecting the rewiring circuits on said upper and lower surfaces to each other by a plating applied on the insulating layer within said through hole; and
    bonding the outer terminal of said wafer to the rewiring circuit of the printed wiring substrate.

4. A method of mounting a wafer to a printed wiring substrate as claimed in claim 1, wherein a plurality of through holes are provided lengthwise and breadthwise in a grid shape on one wafer, the rewiring circuit is formed in each of portions surrounded by the plurality of through holes, and the wafer is cut at positions of the plurality of through holes.

5. A method of mounting a wafer to a printed wiring substrate as claimed in claim 2, wherein a plurality of through holes are provided lengthwise and breadthwise in a grid shape on one wafer, the rewiring circuit is formed in each of portions surrounded by the plurality of through holes, and the wafer is cut at positions of the plurality of through holes.

6. A method of mounting a wafer to a printed wiring substrate as claimed in claim 3, wherein a plurality of through holes are provided lengthwise and breadthwise in a grid shape on one wafer, the rewiring circuit is formed in each of portions surrounded by the plurality of through holes, and the wafer is cut at positions of the plurality of through holes.

* * * * *